United States Patent [19]

Sano et al.

[11] 4,366,383

[45] Dec. 28, 1982

[54] ELECTRON BEAM TYPE PATTERN TRANSFER APPARATUS

[75] Inventors: Shunichi Sano, Zama; Toshiaki Shinozaki, Yokohama; Ichiro Mori, Kodaira, all of Japan

[73] Assignee: VLSI Technology Research Association, Japan

[21] Appl. No.: 165,618

[22] Filed: Jul. 3, 1980

[30] Foreign Application Priority Data

Jul. 6, 1979 [JP] Japan ................... 54-85563

[51] Int. Cl.³ ............... A61K 27/02; G01N 21/64
[52] U.S. Cl. ................... 250/492.3; 250/398; 250/461.1
[58] Field of Search ............ 250/492 A, 492 R, 398, 250/400, 461

[56] References Cited

U.S. PATENT DOCUMENTS

| 3,519,873 | 7/1970 | O'Keefe | 250/492 A |
| 3,551,734 | 12/1970 | O'Keefe et al. | 250/492 A |
| 3,745,358 | 7/1973 | Firtz et al. | 250/492 A |
| 4,227,090 | 10/1980 | Amboss | 250/492 A |

OTHER PUBLICATIONS

"Integrated Circuit—by Livesay, *J. Vacuum Sci. Technology*, vol. 10, No. 6, 1973, pp. 1028–1032.

*Primary Examiner*—Harold A. Dixon
*Attorney, Agent, or Firm*—Finnegan, Henderson, Farabow, Garrett & Dunner

[57] ABSTRACT

An electron beam type pattern transfer apparatus has a photoelectric mask and a sample in a vacuum container made of non-magnetic material. The photoelectric mask is adapted to receive an ultraviolet ray from a light source and emit photoelectrons corresponding to a predetermined transfer pattern and the sample is disposed in parallel with the photoelectric mask with a predetermined distance left therebetween and illuminated with the photoelectrons to form a resist image thereon which corresponds to the transfer pattern. A power source for applying a voltage for accelerating the photoelectrons emitted is connected between the photoelectric mask and the sample. A pair of focusing magnets are disposed around the axis of the vacuum container such that they are located one at one outer side and one in an opposite outer side of the vacuum container to permit a vertical magnetic field to be created between the photoelectric mask and the sample. The focusing magnets have superconductive coils and are driven in a persistent mode.

2 Claims, 2 Drawing Figures

ELECTRON BEAM TYPE PATTERN TRANSFER APPARATUS

BACKGROUND OF THE INVENTION

This invention relates to an electron beam type pattern transfer apparatus for transferring a mask pattern onto a substrate in a vertical magnetic field created by focusing magnets having superconductive coils.

As a conventional electron beam type pattern transfer apparatus an apparatus is known which exposes a substrate to the scanning of an electron beam to form a resist image thereon which corresponds to a predetermined pattern. However, the apparatus requires a long time for the scanning of the electron beam, resulting in lower productivity. There is also an apparatus for illuminating with an X-ray or an electronic ray a mask on which a predetermined pattern is formed and transferring the predetermined pattern to a substrate. Where, however, an X-ray is used, the resist layer suffers a lower sensitivity and, moreover, an X-ray source is expensive and dissipates more power. Where the electronic ray is used, a hollow mask and a corresponding lens system are required, resulting in an expensive apparatus. A pattern transfer apparatus using a photoelectric mask is also known in the art. In order to obtain better resolution it is necessary to provide a uniform focusing magnetic field over a wide range between a photoelectric mask and a substrate. However, it has been difficult to provide such a magnetic field. Now suppose that the thickness of a resist layer on the substrate is 1 $\mu$m, a value necessary for the manufacturing process of an LSI, that the distance between the photoelectric mask and the substrate is made as small as permitted for a high accuracy of exposure, for example, 5 mm and that the intensity of a magnetic field required, when the acceleration voltage of the electron beam between the photoelectric mask and the substrate is above 20 kV, is about 3 KG. In this case, it would be very difficult to obtain a magnetic field by using a focusing magnet which is constituted of an air-core coil of normal electric conductors. In order to obtain a magnetic field of 3 KG it is necessary to significantly increase the ampere turns of the coil. However, there is a problem caused by the generation of heat resulting from the distribution of the winding and the internal resistance, because of the bulkier apparatus. Even if such a bulkier apparatus is implemented, it would be difficult to obtain a uniform magnetic field over a wide area. Stabilization of the magnetic field is also required. Even if objective can be attained by stabilizing the current of the drive source of the focusing magnet, it would be impossible to keep the ripple components of the current of the drive source of the focusing magnet at a zero level. It is therefore next to impossible to generate a magnetic field satisfying the above-mentioned requirements. Recently, in the manufacturing process of an LSI the area of an electron beam resist to which an image is transferred has increased and it would be difficult to apply a uniform magnetic field on such a resist layer corresponding to a transfer pattern. This prevents improvement of the image resolution.

SUMMARY OF THE INVENTION

It is accordingly the object of this invention to provide an electron beam type pattern transfer apparatus which can transfer a mask pattern over a wider range onto a sample with high resolution. According to this invention there is provided an electron beam type pattern transfer apparatus comprising a light source, a vacuum container made of non-magnetic material and having a window through which an ultraviolet ray from the light source passes, a photoelectric mask supported in the vacuum container to receive the ultraviolet ray from the light source causing photoelectrons to be emitted corresponding to a predetermined transfer pattern, a power source connected between the photoelectric mask and a substrate in the vacuum container to apply an acceleration voltage for accelerating photoelectrons, the substrate being disposed parallel with the photoelectric mask with a predetermined distance left therebetween, a pair of focusing magnets comprised of superconductive coils and disposed around the axis of the vacuum container such that they are located one at an outer side and one at an opposite outer side of the vacuum container to permit a vertical magnetic field to be created between the photoelectric mask and the sample, and a magnet drive source connected to the focusing magnets for excitation, in which the sample is illuminated with the photoelectrons emitted from the photoelectric mask to form an electron beam resist image corresponding to the transfer pattern.

Since the focusing magnets are comprised of the superconductive coils and the superconductive coils are driven in a persistent current mode, blooming of the electron beam and variation of the voltage of the power source can be prevented and thus a strong, uniform and stable magnetic field can be created over a wide distance between the photoelectric mask and the sample. As a result, a pattern transfer apparatus of excellent resolution can be obtained. When the superconductive coils are driven in a persistent current mode, they are excited by their own current and thus ideal current without any ripple can be obtained and a saving in electric power can be attained. Furthermore, there is no problem of generation of heat resulting from the internal resistance of the coil. As the strong, uniform and stable magnetic field is created over a wider range by the use of superconductive coils, a sharp image can be obtained through a pattern transfer process and an excellent advantage is obtained in the LSI patterning process. A pattern transfer apparatus can be designed according to a proper choice of specification.

DETAILED DESCRIPTION OF THE PREFERRED EMBODIMENT

The embodiment of this invention will be explained below by referring to the accompanying drawings.

Figure 1:
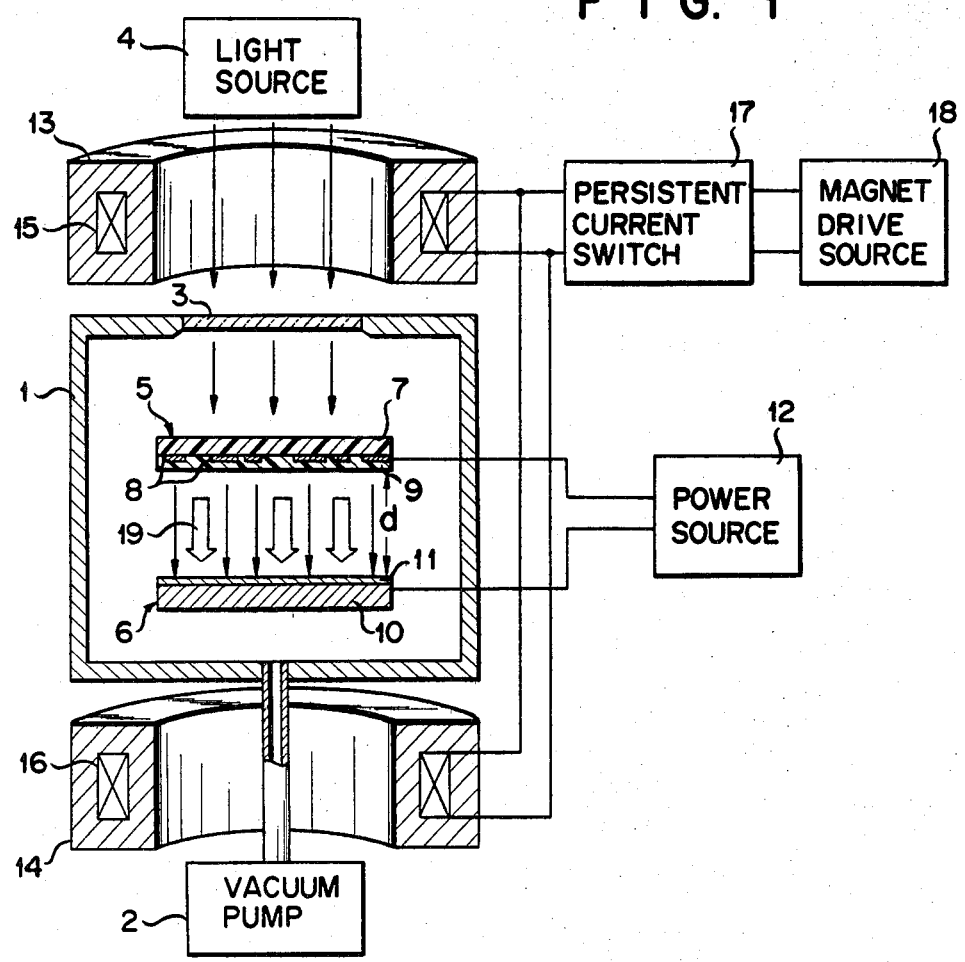
FIG. 1 is a schematic view showing a pattern transfer apparatus according to one embodiment of this invention.
Figure 2:
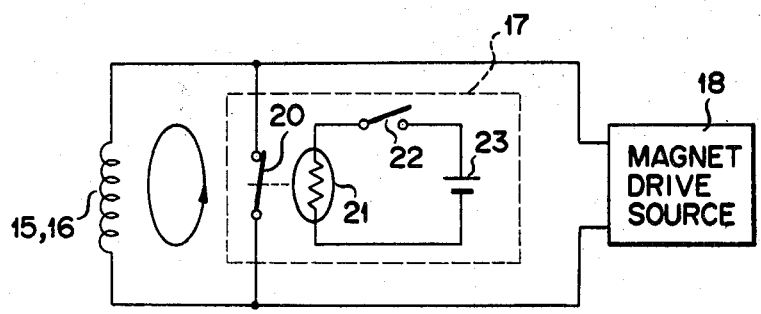
FIG. 2 is a detailed circuit arrangement of a persistent current switch of FIG. 1.

As shown in FIG. 1 a vacuum container 1 made of non-magnetic material is exhausted by a vacuum pump 2 to a vacuum of, for example, $10^{-6}$ torr. A window 3 made of ultraviolet-ray transmissive quartz is provided on one wall of the vacuum container 1. An ultraviolet ray from a light source 4 is directed through the window 3 toward the interior of the vacuum container 1. Within the vacuum container 1 a sample 6 is supported such that it faces a photoelectric mask 5 with a predetermined distance d left between the sample and the photoelectric surface of the photoelectric mask 5. The photoelectric mask 5 is a laminated structure and comprises an ultraviolet-ray transmissive quartz substrate 7, a mask pattern 8 made of a chromium thin film and forming a desired transfer pattern on the substrate and a thin light transmissive conductive layer to form a uniform electric field and a photoelectric layer 9 made of cesium iodide (CsI) and formed on the mask pattern 8 to emit photoelectrons when mask 5 is impinged by the ultraviolet ray. An electron sensitive resist 11 such as polymethylmethacrylate (PMMA) is coated on that surface of the substrate 10 which the photoelectric layer faces. A DC power source 12 for accelerating photoelectrons emitted from the photoelectric mask 5 is connected between the substrate 10 and the mask pattern 8 of the photoelectric mask 5. A pair of focusing magnets 13, 14 are arranged, as a so-called "Helmholtz Coil", around the axis of the vacuum container such that they are located one at one outer side and one at the opposite outer side of the vacuum container. The focusing magnets 13, 14 are usually called a "cryostat" and are annular in configuration and arranged such that they are spaced a predetermined distance apart from each other. The focusing magnets 13 and 14 have superconductive coils 15 and 16, respectively. The superconductive coils 15 and 16 are formed of niobium-titanium wires are super cooled by liquid helium. The superconductive coils 15 and 16 are connected through a persistent current switch 17 to a magnet drive source 18 for excitation. When the coils 15 and 16 are excited, a vertical magnetic field 19 is created between the photoelectric mask 5 and the sample 6. When the persistent current switch 17 is switched, the superconductive coils 15 and 16 are driven in a persistent current mode. The persistent current switch 17 is connected, as shown in FIG. 2, between the superconductive coils 15, 16 on one hand and the magnet drive source 18 on the other hand. Stated in more detail, the persistant current switch 17 comprises a first switch 20 connected in parallel with the superconductive coils 15, 16 and creating a current shunt with respect to the magnet drive source 18, a heater 21 disposed in the neighborhood of the first switch 20 and adapted to control the opening and closing of the first switch 20 by its temperature variation, and a DC power source 23 connected through a second switch 22 to the heater 21 which acts as a heating source.

The operation of a pattern transfer apparatus of this invention will be explained below. An ultraviolet ray from the light source 4 is incident onto the photoelectric mask 5 through the window 3 of the vacuum container 1. The DC power source 12 supplies a stable DC voltage of, for example, 20 KV between the mask pattern 8 of the photoelectric mask 5 and the substrate 10 of the sample 6. A vertical magnetic field 19 created by the focusing magnets 13, 14 is applied between the photoelectric mask 5 and the sample 6. The superconductive coils 15, 16 comprise a pair of focusing magnets 13, 14 which are excited by the magnet drive source 18 and switched to the persistent current mode by the switching operation of the persistent current switch 17 so that it is maintained in that mode. When the ultraviolet ray falls onto the photoelectric mask 5 photoelectrons are emitted from the photoelectric layer 9 of the photoelectric mask 5. The value of a vertical magnetic field B necessary for the photoelectrons to be focused onto the sample can be generally expressed as follows:

$$B = \pi \sqrt{\frac{2m}{e}} \cdot \sqrt{\frac{V}{d}}$$

where
  m: the mass of electrons
  e: the charge of electrons
  V: the acceleration voltage of photoelectrons
  d: a distance between the photoelectric mask 5 and the sample 6

Now suppose that, with the acceleration voltage V of 20 KV and the distance d of 5 mm, Helmholtz type coils of, for example, about 90 cm in diameter are used as the superconductive coils 15, 16 of the focusing magnets 13, 14. In this case, a vertical magnetic field of about 3 KG can be readily obtained with coils of about 147,000 AT (ampere turns), provided that variation of acceleration voltage V is suppressed to below 0.02% and that variation of the vertical magnetic field B is suppressed to below 0.01%. Some of the ultraviolet rays incident onto the photoelectric mask 5 are interrupted by the mask pattern 8 and some are uninterrupted, thereby reaching the photoelectric layer 9. As a result, electron beams corresponding to the configuration of the mask pattern 8 are illuminated onto the surface of the electron beam resist 11 of the sample 6. When the illumination is continued for a predetermined time period, the electron beam resist 11 suffers a light exposure corresponding to the pattern configuration. In this way, the pattern transfer is effected. The resultant sample is taken out of the vacuum container 1 and subjected to a predetermined developing process, rendering a resist image of the corresponding transfer pattern visible. For example, for a sample of 5 inches in diameter a resist image of excellent resolution is obtained with an accuracy of below 0.5 μm, provided that the variation of the acceleration voltage V and value of the vertical magnetic field B are held to the above-mentioned values. In the above-mentioned embodiment, the superconductive coils 15, 16 are super-cooled by liquid helium and excited by an output from the magnet drive source 18. If at this time the second switch 22 is closed and heater 21 is heated by the closure of the DC power source 23, the first switch 20 is held in the open state. If the second switch 22 is opened with the superconductive coil 15, 16 excited, the temperature of the heater 21 is lowered and the first switch 20 is closed. In consequence, a closed circuit is created between the superconductive coils 15, 16 and the first switch 20, thus exciting the superconductive coils in the persistent current mode. In this way, the superconductive coils are excited by their own current in a persistent current mode, permitting a saving in electric power. Moreover, no ripple problem occurs.

This invention is not restricted to the abovementioned embodiment. For example, the structure of the superconductive coils, as well as the structure of the photoelectric mask and its material, can be properly determined according to a proper choice of the specification.

What is claimed is:
1. An electron beam type pattern transfer apparatus comprising:
  a light source;
  a vacuum container made of non-magnetic material and having a window through which an ultraviolet ray passes;

a photoelectric mask supported in the vacuum container and adapted to receive the ultraviolet ray from said light source and emit photoelectrons corresponding to a predetermined transfer pattern;

a power source connected between said photoelectric mask and a sample disposed parallel to said photoelectric mask such that it faces the photoelectric mask with a predetermined distance left therebetween, and adapted to apply an acceleration voltage for accelerating said photoelectrons;

a pair of focusing magnets arranged around the axis of the vacuum container such that they are located one at one outer side and one at the opposite outer side of said vacuum container and comprised of superconductive coils, respectively, for creating simultaneously a uniform and stabilized vertical magnetic field between the photoelectric mask and the sample; and a magnet drive source connected to the focusing magnets for excitation, in which the sample is illuminated with the photoelectrons emitted from the photoelectric mask so that a resist image corresponding to the transfer pattern is formed on the sample; and a persistent current switch connected in parallel between the superconductive coil of the focusing magnet and the magnet drive source to switch the superconductive coil to a persistent current mode for minimizing the ripple of the magnetic field.

2. An electron beam type pattern transfer device according to claim 1, in which said photoelectric mask comprises a quartz substrate onto which said ultraviolet ray is incident, a mask pattern formed of a chromium thin film and forming a desired transfer pattern on the quartz substrate, and a photoelectric layer made of cesium iodide, including the mask pattern and formed on the surface of the quartz substrate to receive the ultraviolet ray and emit photoelectrons.

* * * * *